United States Patent [19]

Harrison

[11] Patent Number: 5,926,047
[45] Date of Patent: Jul. 20, 1999

[54] SYNCHRONOUS CLOCK GENERATOR INCLUDING A DELAY-LOCKED LOOP SIGNAL LOSS DETECTOR

[75] Inventor: Ronnie M. Harrison, Boise, Id.

[73] Assignee: Micron Technology, Inc., Boise, Id.

[21] Appl. No.: 08/921,237

[22] Filed: Aug. 29, 1997

[51] Int. Cl.[6] .................................................. H03L 7/06
[52] U.S. Cl. ........................................ 327/159; 327/155
[58] Field of Search .......................... 327/3, 12, 22–27, 327/72, 146, 147, 149, 150, 152, 153, 155, 156, 158, 159, 161, 163, 218, 236, 238, 239, 241, 244, 254, 259

[56] References Cited

U.S. PATENT DOCUMENTS

| 4,077,016 | 2/1978 | Sanders et al. ............................. 331/4 |
| 4,096,402 | 6/1978 | Schroeder et al. ....................... 307/362 |

(List continued on next page.)

FOREIGN PATENT DOCUMENTS 0 295 515 A1  12/1988  European Pat. Off. .
0 406 786 A1   1/1991  European Pat. Off. .

(List continued on next page.)

OTHER PUBLICATIONS

Maneatis, Low–Jitter Process–Independent DLL and PLL Based of Self–Biased Techniques, Nov. 1996, IEEE Journal of Solid–State Circuits, vol. 31, Nov. 11, pp. 1723–1732.

Alvarez, J. et al. "A Wide–Bandwidth Low Voltage PLL for PowerPC™ Microprocessors" IEEE IEICE Trans. Electron., vol. E–78. No. 6, Jun. 1995, pp. 631–639.

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Arai, Y. et al., "A CMOS Four Channel×1K Time Memory LSI with 1–ns/b Resolution", IEEE Journal of Solid–State Circuits, vol. 27, No. 3,M, 8107 Mar., 1992, No. 3, New York, US.

Arai, Y. et al., "A Time Digitizer CMOS Gate–Array with a 250 ps Time Resolution", XP 000597207, IEEE Journal of Solid–State Circuits, vol. 31, No. 2, Feb. 1996.

Aviram, A. et al., "Obtaining High Speed Printing on Thermal Sensitive Special Paper with a Resistive Ribbon Print Head", IBM Technical Diclosure Bulletin, vol. 27, No. 5, Oct. 1984, pp. 3059–3060.

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Intergrated High Resolution CMOS Timing Generator Based on an Array of Delay Locked Loops", IEEE Journal of Solid–State Circuits, vol. 31, No. 7, Jul. 1996, pp. 952–957.

(List continued on next page.)

Primary Examiner—My-Trang Nu Ton
Attorney, Agent, or Firm—Seed and Berry LLP

[57] ABSTRACT

A loss of signal detector for use with a delay-locked loop of the type which produces a plurality of output signals in response to a clock signal is comprised of a first monitor for receiving a first one of the plurality of output signals from the delay-locked loop. The second monitor receives a second one of the plurality of output signals from the delay-locked loop. The first and second signals are preferably, but not necessarily, in quadrature with respect to one another. Each of the monitors is clocked with a clock signal and the inverse of the clock signal. A plurality of logic gates is responsive to the first and second monitors for producing an output signal.

16 Claims, 5 Drawing Sheets

U.S. PATENT DOCUMENTS

| | | | |
|---|---|---|---|
| 4,404,474 | 9/1983 | Dingwall | 307/260 |
| 4,511,846 | 4/1985 | Nagy et al. | 328/164 |
| 4,514,647 | 4/1985 | Shoji | 307/269 |
| 4,638,187 | 1/1987 | Boler et al. | 307/451 |
| 4,687,951 | 8/1987 | McElroy | 307/269 |
| 4,773,085 | 9/1988 | Cordell | 375/120 |
| 4,789,796 | 12/1988 | Foss | 307/443 |
| 4,893,087 | 1/1990 | Davis | 328/14 |
| 4,902,986 | 2/1990 | Lesmeister | 331/25 |
| 4,958,088 | 9/1990 | Farah-Bakhsh et al. | 307/443 |
| 4,984,204 | 1/1991 | Sato et al. | 365/189.11 |
| 5,020,023 | 5/1991 | Smith | 364/900 |
| 5,038,115 | 8/1991 | Myers et al. | 331/2 |
| 5,086,500 | 2/1992 | Greub | 395/550 |
| 5,087,828 | 2/1992 | Sato et al. | 327/24 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hesson | 307/270 |
| 5,179,298 | 1/1993 | Hirano et al. | 307/443 |
| 5,194,765 | 3/1993 | Dunlop et al. | 307/443 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,256,989 | 10/1993 | Parker et al. | 331/1 A |
| 5,257,294 | 10/1993 | Pinto et al. | 375/120 |
| 5,268,639 | 12/1993 | Gasbarro et al. | 324/158 R |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,283,631 | 2/1994 | Koerner et al. | 307/451 |
| 5,295,164 | 3/1994 | Yamamura | 375/120 |
| 5,311,481 | 5/1994 | Casper et al. | 365/230.06 |
| 5,321,368 | 6/1994 | Hoelzle | 328/63 |
| 5,337,285 | 8/1994 | Ware et al. | 365/227 |
| 5,347,177 | 9/1994 | Lipp | 307/443 |
| 5,347,179 | 9/1994 | Casper et al. | 307/451 |
| 5,355,391 | 10/1994 | Horowitz et al. | 375/36 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,408,640 | 4/1995 | MacIntyre et al. | 395/550 |
| 5,420,544 | 5/1995 | Ishibashi | 331/11 |
| 5,428,311 | 6/1995 | McClure | 327/276 |
| 5,430,676 | 7/1995 | Ware et al. | 365/189.02 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,440,514 | 8/1995 | Flannagan et al. | 365/194 |
| 5,446,696 | 8/1995 | Ware et al. | 365/222 |
| 5,448,193 | 9/1995 | Baumert | 327/156 |
| 5,451,898 | 9/1995 | Johnson | 327/536 |
| 5,457,407 | 10/1995 | Shu et al. | 326/30 |
| 5,473,274 | 12/1995 | Reilly et al. | 327/155 |
| 5,473,575 | 12/1995 | Farmwald et al. | 365/230.06 |
| 5,473,639 | 12/1995 | Lee et al. | 375/376 |
| 5,485,490 | 1/1996 | Leung et al. | 375/371 |
| 5,488,321 | 1/1996 | Johnson | 327/66 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,539,345 | 7/1996 | Hawkins | 327/159 |
| 5,552,727 | 9/1996 | Nakao | 327/159 |
| 5,568,077 | 10/1996 | Sato et al. | 327/199 |
| 5,572,557 | 11/1996 | Aoki | 375/376 |
| 5,574,698 | 11/1996 | Raad | 365/230.06 |
| 5,576,645 | 11/1996 | Farwell | 327/94 |
| 5,577,236 | 11/1996 | Johnson et al. | 395/551 |
| 5,578,940 | 11/1996 | Dillon et al. | 326/30 |
| 5,578,941 | 11/1996 | Sher et al. | 326/34 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,614,855 | 3/1997 | Lee et al. | 327/158 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,657,481 | 8/1997 | Farmwald et al. | 395/551 |
| 5,668,763 | 9/1997 | Fujioka et al. | 365/200 |
| 5,692,165 | 11/1997 | Jeddeloh et al. | 395/551 |
| 5,694,065 | 12/1997 | Hamasaki et al. | 327/108 |
| 5,712,580 | 1/1998 | Baumgartner et al. | 327/254 |
| 5,719,508 | 2/1998 | Daly | 327/12 |
| 5,751,665 | 5/1998 | Tanoi | 368/120 |
| 5,789,947 | 8/1998 | Sato | 327/3 |

FOREIGN PATENT DOCUMENTS

| | | |
|---|---|---|
| 0 450 871 A2 | 10/1991 | European Pat. Off. . |
| 0 476 585 A2 | 3/1992 | European Pat. Off. . |
| 0 655 741 A2 | 5/1995 | European Pat. Off. . |
| 0 680 049 A2 | 11/1995 | European Pat. Off. . |
| 0 704 848 A3 | 4/1996 | European Pat. Off. . |
| 0 704 975 A1 | 4/1996 | European Pat. Off. . |
| 0 767 538 A1 | 4/1997 | European Pat. Off. . |
| 2-112317 | 4/1990 | Japan . |
| 4-135311 | 8/1992 | Japan . |
| 5-136664 | 1/1993 | Japan . |
| 5-282868 | 10/1993 | Japan . |
| WO 94/29871 | 12/1994 | WIPO . |
| WO 95/22200 | 8/1995 | WIPO . |
| WO 95/22206 | 8/1995 | WIPO . |
| WO 96/10866 | 4/1996 | WIPO . |
| WO 97/14289 | 4/1997 | WIPO . |
| WO 97/42557 | 11/1997 | WIPO . |

OTHER PUBLICATIONS

Combes, M. et al., "A Portable Clock Multiplier Generator Using Digital CMOS Standard Cells", IEEE Journal of Solid–State Circuits, vol. 31, No. 7, Jul. 1996, pp. 958–965.

Descriptive literature entitled, "400MHz SLDRAM, 4M X 16 SLDRAM Pipeland, Eight Bank, 2.5 V Operation," SLDRAM Consortium Advance Sheet, published throughtout the United States, pp. 1–22.

Donnelly, K. et al., "A 660 MB/s Interface Megacell Portable Circuit in 0.3 $\mu$m–0.7 $\mu$m CMOS ASIC", IEEE Journal of Solid–State Circuits, vol. 31, No. 12, Dec. 1996, pp. 1995–2001.

"Draft Standard for a High–Speed Memeory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Goto, J. et al., "A PLL–Based Programmable Clock Generator with 50– to 350–MHz Oscillating Range for Video Signal Processors", IEICE Trans. Electron., vol. E77–C, No. 12, Dec. 1994, pp. 1951–1956.

Hamamoto, T., 400–MHz Random Column Operating SDRAM Techniques with Self–Skew Compensation, IEEE Jounral of Solid–State Circuits, vol. 33, No. 5, May 1998, pp. 770–778.

Ishibashi, A. et al., "High–Speed Clock Distribution Architecture Employing PLL for 0.6μm CMOS SOG", IEEE Custom Integrated Circuits Conference, 1992, pp. 27.6.1–27.6.4.

Kim, B. et al., "A 30MHz High–Speed Analog/Digital PLL n 2μm CMOS", ISSCC, Feb. 1990.

Kikuchi, S. et al., "A Gate–Array–Based 666MHz VLSI Test System", IEEE International Test Conference, Paper 21.1, 1995, pp. 451–458.

Ko, U. et al., "A 30–ps Jitter, 3.6–μs Locking, 3.3–Volt Ditigal PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s Dram", IEEE International Solid–State Circuits Conference Digest of Technical Papers, Paper No. FA 18.6, 1994, pp. 300–301.

Lesmeister, G., "A Densely Intergrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Nakamura, M. et al., "A 156 Mbps CMOS Clock Recovery Circuit for Burst–mode Transmission", Symposium on VlSI Circuits Digest of Technical Papers, 1996, pp. 122–123.

Neilson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Intergrating Receivers", IEEE Jounral of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range", in *1997 IEEE International Solid State Circuits Conference*, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, Nov. 1991, pp. 1493–1497.

Tanoi, S. et al., "A 250–622 MHz Deskew and Jitter–Suppressed Clock Buffer Using a Frequency– and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol. E–79–C. No. 7, Jul. 1996, pp. 898–904.

von Kaenel, V. et al., "A 320 MHz, 1.5 mW @ V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al., "A 622Mb/s Bit/Frame Synchronizer for High–Speed Backplane Data Communication", IEEE Journal of Solid–State Circuits, vol. 31, No. 7, Jul. 1996, pp. 1063–1066.

SYNCHRONOUS CLOCK GENERATOR INCLUDING A DELAY-LOCKED LOOP SIGNAL LOSS DETECTOR

CROSS REFERENCE TO RELATED APPLICATION

This application is related to U.S. patent application Ser. No. 08/921,236 filed on the same day as the instant application by the same assignee as the present invention and entitled Synchronous Clock Generator Including A False Lock Detector.

BACKGROUND OF THE INTENTION

1. Field of the Invention

The present invention is directed generally to the field of integrated circuits and, more particularly, to the generation of clock signals for controlling the operation of such circuits.

2. Description of the Background

Many high-speed integrated circuit devices, such as synchronous dynamic random access memories (SDRAM), microprocessors, etc. rely upon clock signals to control the flow of commands, data, addresses, etc., into, through, and out of the devices. Additionally, new types of circuit architectures such as RAMBUS and SLD RAM require individual parts to work in unison even though such parts may individually operate at different speeds. As a result, the ability to control the operation of a part through the generation of local clock signals has become increasingly more important.

Typically, operations are initiated at the edges of the clock signals (i.e., transitions from high to low or low to high). To more precisely control the timing of operations within the device, each period of a clock signal is sometimes divided into subperiods so that certain operations do not begin until shortly after the clock edge.

One method for controlling the timing of operations within a period of a clock signal generates phase-delayed versions of the clock signal. For example, to divide the clock period into four subperiods, phase delayed versions are produced that lag the clock signal by 90°, 180° and 270°, respectively. Edges of the phase-delayed clock signals provide signal transitions at the beginning or end of each subperiod that can be used to initiate operations.

An example of such an approach is shown in FIG. 1 where the timing of operations in a memory device 10 is defined by an externally provided reference control clock signal CCLKREF and an externally provided reference data clock signal DCLKREF. The reference clock signals CCLKREF, DCLKREF are generated in a memory controller 11 and transmitted to the memory device 10 over a control clock bus 13 and a data clock bus 14, respectively. The reference clock signals CCLKREF, DCLKREF have identical frequencies, although the reference control clock signal CCLKREF is a continuous signal and the reference data clock signal DCLKREF is a discontinuous signal, i.e., the reference data clock signal DCLKREF does not include a pulse for every clock period. Although the reference clock signals CCLKREF, DCLKREF have equal frequencies, they may be phase shifted by a lag time upon arrival at the memory device 10 due to differences in propagation times, such as may be produced by routing differences between the control clock bus 13 and the data clock bus 14.

Control data CD1-CDN arrive at respective input terminals 16 substantially simultaneously with pulses of the reference control clock signal CCLKREF and are latched in respective control data latches 18. However, if the device attempts to latch the control data CD1-CDN immediately upon the edge of the reference clock signal CCLKREF, the control data may not have sufficient time to develop at the input terminals 16. For example, a voltage corresponding to a first logic state (e.g., a "0") at one of the input terminals 16 may not change to a voltage corresponding to an opposite logic state (e.g., a "1") by the time the data are latched. To allow time for the control data CD1-CDN to fully develop at the input terminals 16, the control data are latched at a delayed time relative to the reference control clock signal CCLKREF. To provide a clock edge to trigger latching of the control data CD1-CDN at the delayed time, a delay circuit 20 delays the reference clock signal CCLKREF by a delay time to produce a first delayed clock signal CCLKD. Edges of the first delayed clock signal CCLKD activate the control data latches 18 to latch the control data CD1-CDN.

Data DA1-DAM arrive at data terminals 22 substantially simultaneously with the reference data clock signal DCLKREF. Respective data latches 24 latch the data DA1-DAM. As with the control data CD1-CDN, it is desirable that the data DA1-DAM be latched with a slight delay relative to transitions of the reference data clock DCKLREF to allow time for signal development at the data terminals 22. To provide a delayed clock edge, a delay circuit 26 delays the reference data clock signal DCLKREF to produce a phase-delayed data clock DCLKD that is delayed relative to the reference data clock signal DCLKREF.

For latching both control data CD1-CDN and data DA1-DAM, it is often desirable to allow some adjustment of the phase delay. For example, if the clock frequencies change, the duration of the subperiods will change correspondingly. Consequently, the delayed clocks CCLKD, DCLKD may not allow sufficient signal development time before latching the control data or data, respectively. Also, variations in transmission times of control data, data, or clock signals may cause shifts in arrival times of control data CD1-CDN or data DA1-DAM relative to the clock signals CCLKREF, DCLKREF of the memory device 10.

One possible approach to producing a variable delay is for the control clock generator to employ a delay-locked loop 28 driven by the external reference clock CLKREF, as shown in FIG. 2. The reference clock signal CLKREF is input to a conventional, multiple output, variable delay line 30 such as that described in Maneatis, "Low-Jitter Process-Independent DLL and PLL Based on Self-Biased Techniques," *IEEE Journal of Solid-State Circuits* 31(11): 1723–1732, November 1996. The delay line 30 is a known circuit that outputs multiple delayed signals CLKI-CLKN with increasing lags relative to the reference signal CLKREF. The delays of the signals CLK1-CLKN are variably responsive to a control signal Vcon received at a control port 32.

A feedback path, formed by a comparator 34 and an integrator 36, produces the control signal Vcon. The feedback path receives the reference clock signal CLKREF at one input of the comparator 34 and receives one of the output signals CLKN from the delay line 30 as a feedback signal at the other input of the comparator 34. The comparator 34 outputs a compare signal Vcomp that is integrated by the integrator 36 to produce the control signal Vcon.

As is known, the control signal Vcon will depend upon the relative phases of the reference clock signal CLKREF and the feedback signal CLKN. If the feedback signal CLKN leads the reference clock signal CLKREF, the control signal Vcon increases the delay of the delay line 30, thereby reducing the magnitude of the control signal Vcon until the feedback signal CLKN is in phase with the reference signal CLKREF. Similarly, if the feedback signal CLK lags the reference signal CLKREF, the control signal Vcon causes the delay line 30 to decrease the delay until the feedback signal CLKN is in phase with the reference signal CLKREF.

In the process of acquiring lock, or if the delay-locked loop 28 is disturbed by an unwanted transient on the power supply, temporary interruption of clock signal, etc., the control voltage Vcon may drive the delay line 30 to the point where the delay line 30 no longer passes a signal. That may occur because voltage-controlled delay lines are generally low-pass devices. More delay causes the cutoff frequency to drop. If that occurs, the phase detector may hang in a state that forces the control voltage to remain at a level which prevents signal transmission through the voltage-controlled delay line 30. The loop 28 will be hung up, with no output clock signals being produced. Should that occur, it is imperative that the condition be rectified as soon as possible. Thus, there is a need for a loss of signal detector which may detect hang up of the loop 28 and take, or initiate, corrective action.

SUMMARY OF THE INVENTION

The present invention is directed to a loss of signal detector for use with a delay-locked loop of the type which produces a plurality of output signals in response to a clock signal. The detector is comprised of a first monitor for receiving a first one of the plurality of output signals from the delay-locked loop. The second monitor receives a second one of the plurality of output signals from the delay-locked loop. The "second" output signal could be a time delayed version of the first output signal. The first and second signals are preferably, but not necessarily, in quadrature with respect to one another. Each of the monitors is clocked with a clock signal and the inverse of the clock signal. A plurality of logic gates is responsive to the first and second monitors for producing an output signal.

The loss of signal detector of the present invention may be incorporated into a synchronous clock generator which comprises a receiver for receiving an external clock signal. A delay line produces a plurality of signals in response to the external clock signal. Each of the plurality of signals is delayed a predetermined period of time with respect to the external clock signal. A plurality of multiplexers is responsive to the delay line for producing at least one clock signal in response to control signals. A first feedback path is responsive to certain of the plurality of signals for producing a feedback signal input to the delay line. A first monitor receives a first one of the plurality of output signals from the delay line while a second monitor receives a second one of the plurality of output signals from the delay line. The first and second signals are substantially in quadrature with respect to each other. Each of the monitors is clocked with the external clock signal and the inverse of the external clock signal. A plurality of logic gates is responsive to the first and second monitors for producing an output signal.

The signal loss detector of the present invention provides an early indication that the delay-locked loop has ceased production of local clock signals. The output of the signal loss detector can be used to take corrective action or to initiate corrective action. By promptly recognizing and correcting the loss of signal condition, more adverse consequences resulting from the loss of local clock pulses may be avoided. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
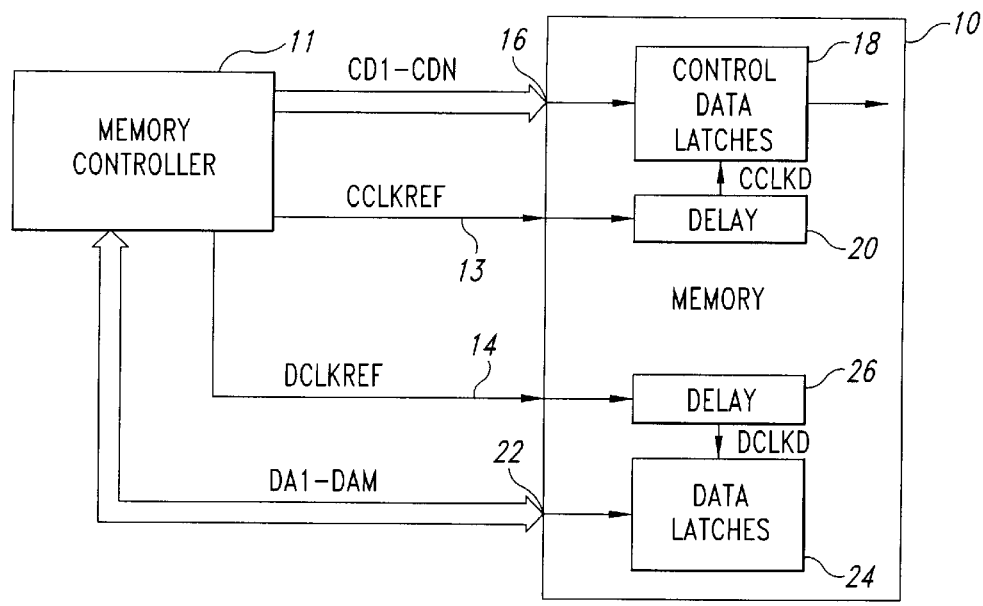
FIG. 1 is a block diagram of a prior art memory system including a memory device and a memory controller linked by control data and data buses.
Figure 2:
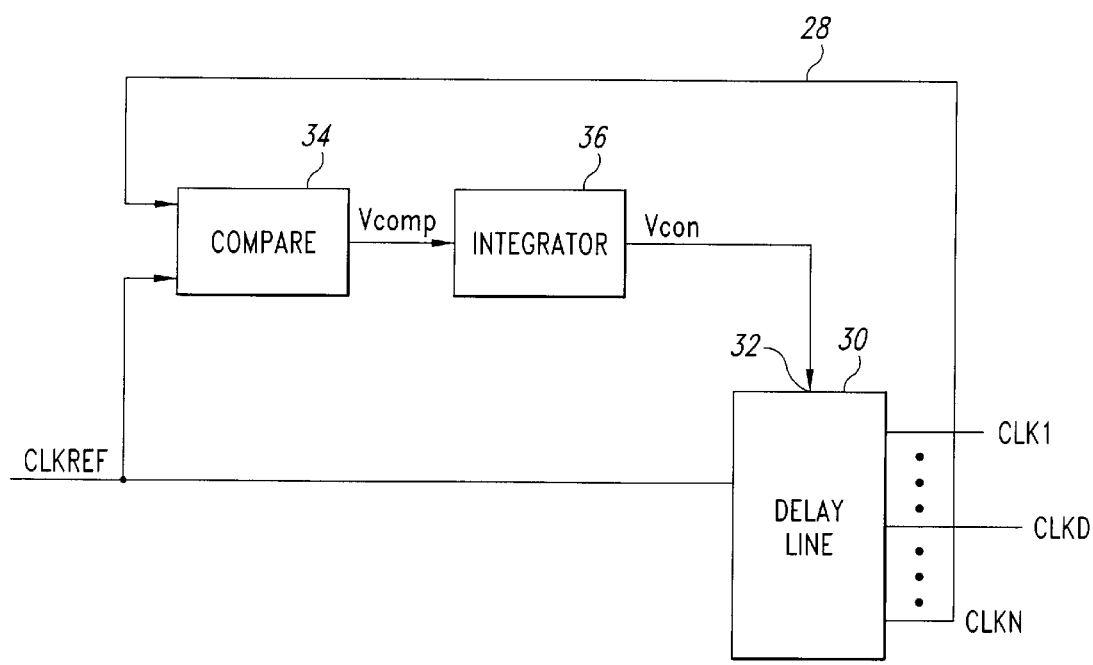
FIG. 2 is a block diagram of a prior art delay-locked loop driven by an external control reference clock signal.
Figure 3:
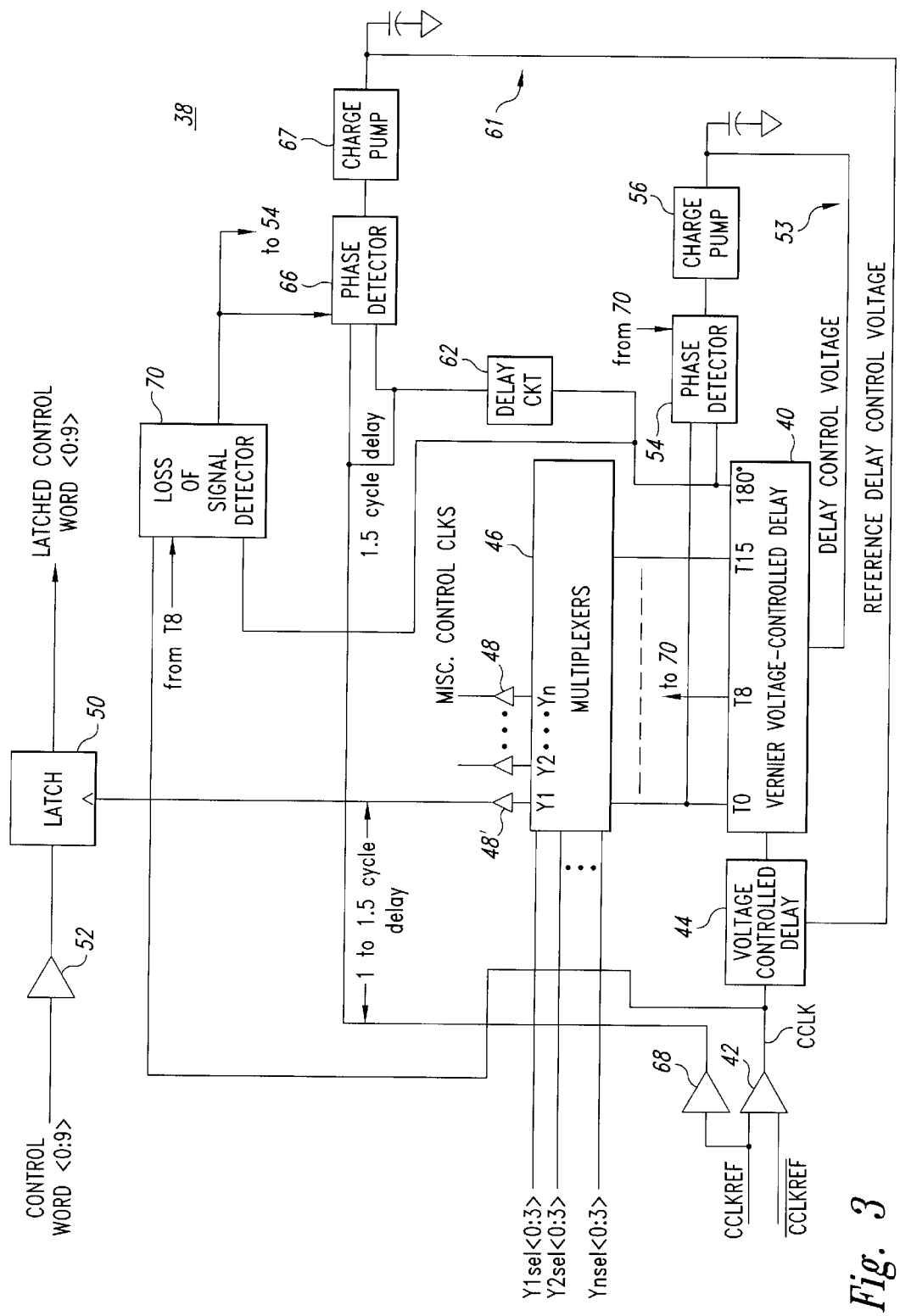
FIG. 3 is a block diagram of a synchronous clock generator including a loss of signal detector according to the teachings of the present invention.

FIG. 3 is a block diagram of a synchronous clock generator circuit 38. The circuit 38 illustrated in FIG. 3 is designed for use by a dynamic random access memory (DRAM) which is used in a SLD RAM architecture. Although the present invention is described with respect to a particular circuit used in a particular architecture, the reader will understand that the concepts of the present invention may be used in other circuits as well as other circuit architectures. The present invention may be employed wherever it is desirable to precisely control the production of local clock signals.

A major component of the circuit 38 is a delay line 40. The delay line 40 may be constructed according to the teachings of the prior art as set forth in the article entitled "Low-Jitter Process-Independent DLL and PLL Based on Self-Biased Techniques." As is known in the art, the delay line 40 has a number of taps associated therewith. As shown in FIG. 3, the delay line 40 has taps labeled T0–T15, with the last tap labeled 180°. Alternatively, the delay line 40 may be a vernier voltage-controlled delay line 40 of the type disclosed in U.S. patent application Ser. No. 08/879,847 filed Jun. 20, 1997 and entitled Method And Apparatus For Generating A Sequence Of Clock Signals, which is assigned to the same assignee as the present invention.

The delay line 40 receives clock signals that are received at a differential receiver 42. The differential receiver 42 receives the signals CCLKREF, $\overline{\text{CCLKREF}}$. The present invention will work with a variety of receivers other than the differential receiver 42 illustrated in FIG. 3. The clock signal CCLK is input to the delay line 40 through a voltage controlled delay circuit 44.

The output of the delay line 40 is input to a plurality of multiplexers 46 which produce clock signals input to clock drivers 48. One of the clock drivers 48' produces a clock signal which is input to a latch 50. The latch 50 receives control data through a receiver 52 and latches that data in response to the clock signal output by the clock driver 48'. The latched control data is available at the output of the latch 50.

A first feedback path 53 is comprised of a phase detector 54 and a charge pump 56. The phase detector 54 receives two signals from the delay line 40 such as the signal available at the T0 tap and the signal available at the 180° tap. From those signals, a control signal is generated which is input to the charge pump 56. Charge pump 56 produces a delay control voltage input to the delay line 40. The first feedback path 53 and the delay line 40 comprise a delay-locked loop.

The delay line 40 may be provided with a second, or compound, feedback path 61. The second feedback path 61 is comprised of a delay matching circuit 62, a phase detector 66, and a charge pump 67. The phase detector 66 receives the clock reference CCLKREF through a receiver 68 and a signal from the delay matching circuit 62. The phase detector 66 and charge pump 67 work in the same manner as the phase detector 54 and charge pump 56. Based on the signals input to the phase detector 66, the charge pump 67 produces a reference delay control voltage which is input to the voltage controlled delayed circuit 44. As a result, the delay-locked loop can be tuned by the second feedback path 61 to add or subtract delay to the loop by controlling the voltage control delay circuit 44. Additional information about the feedback path 61 is found in U.S. patent application Ser. No. 08/915,195 filed herewith and entitled Synchronous Clock Generator Including A Compound Delay-Locked Loop, which is assigned to the same assignee as the present invention.

Completing the description of FIG. 3, a loss of signal detector 70 constructed according to the teachings of the present invention is provided. The loss of signal detector 70 receives the clock signal CCLK which is available at an output terminal of the voltage control delay circuit 44. The loss of signal detector 70 also receives two signals from the delay line 40 such as the quad signal (90° signal) and the 180° signal. As discussed below, however, other signals may be used. The loss of signal detector 70 produces an output signal, which is input to the phase detector 54 and the phase detector 66 whenever a loss of signal is detected by the detector 70. The output signal causes the phase detectors 54, 66 to control the charge pumps 56, 67, respectively, to force the delay-locked loop to begin producing signal again.

Figure 4:
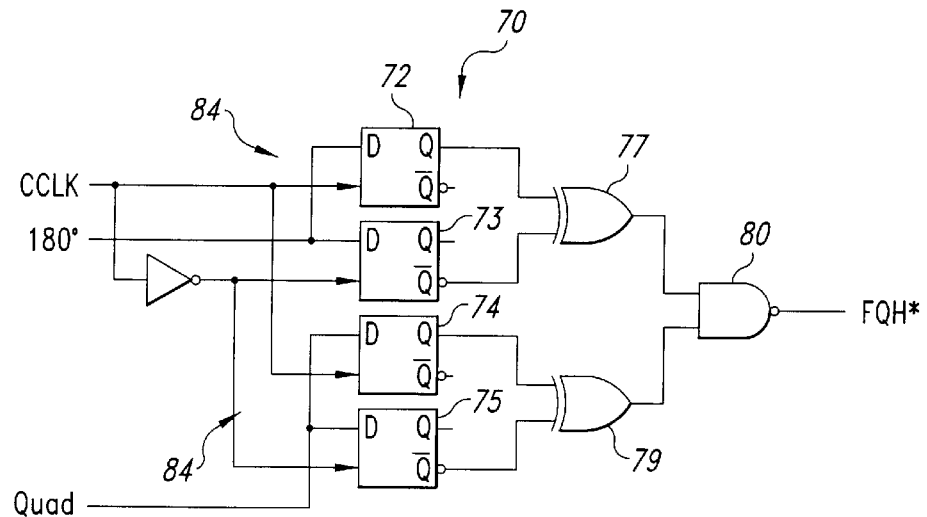
FIG. 4 illustrates one embodiment of a loss of signal detector that may be used in the synchronous clock generator shown in FIG. 3.

FIG. 4 illustrates one embodiment of a loss of signal detector 70 that may be used in conjunction with the synchronous clock generator 38 shown in FIG. 3 while FIGS. 5A–5D illustrate exemplary signals that may be input to the detector 70. In FIG. 4, the detector 70 is comprised of first, second, third, and fourth logic circuits 72–75, respectively, which may be D-type flip-flops. The first and second logic circuits 72, 73, respectively, operate together to form a first monitor 82; the second and third logic circuits 74, 75, respectively, operate together to form a second monitor 84. A first logic gate 77 is responsive to the first monitor 82 while a second logic gate 79 is responsive to the second monitor 84. A third logic gate 80 is responsive to the first logic gate 77 and the second logic gate 79.

Figure 5A:
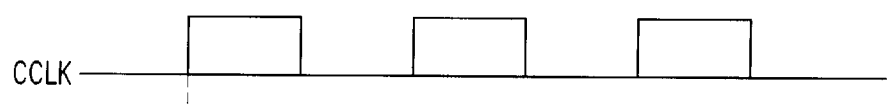
FIGS. 5A–5D are a timing diagram helpful in understanding the operation of the loss of signal detector shown in FIG. 4.
Figure 5B:
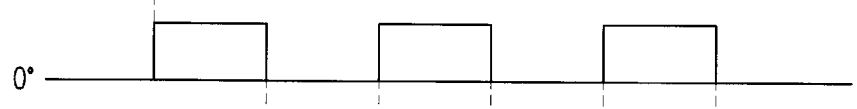
Figure 5C:
Figure 5D:
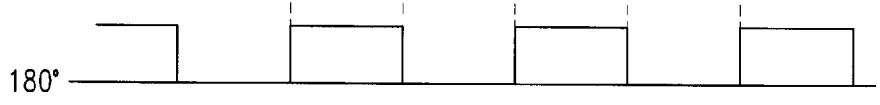

If the delay-locked loop of the synchronous clock generator circuit 38 is locked, and the delay line 40 is passing signal, a signal at the input of the delay line 40 (the CCLK signal shown in FIG. 5A) will have the same frequency as a signal at the output of the delay line 40 (the 180° signal shown in FIG. 5D). Sampling the 180° signal of FIG. 5D by clocking the flip-flop 72 with both edges of the input clock signal CCLK and clocking the flip-flop 73 with both edges of the inverse of the input clock signal CCLK will produce opposite logic levels at the Q output terminals of the flip-flops 72, 73. Gating the signal available at the Q output terminal of the flip-flop 72 and the signal available at the $\overline{Q}$ output terminal of flip-flop 73 with the logic gate 77 yields an output signal having a low logic level whenever the correct predetermined phase relationship exists between the signals CCLK and 180°. If the signals available at the Q output terminals of the flip-flops 72, 73 ever have the same value, the signal at the D inputs is not changing state indicating that the delay line 40 is not passing a signal. When the signals at the Q output terminals have the same value, the output signal will change to a high logic state and propagate through gate 80.

The clock signal CCLK of FIG. 5A is shown as having an arbitrary phase relationship with the signal shown in FIG. 5B due to internal propagation delays, clock driver delays, etc. Race conditions may give a false indication. The present invention addresses that problem by adding the D-type flip-flops 74, 75. The flip-flops 74, 75 operate in a way which is identical to the manner in which flip-flops 72, 73 operate, except that a signal in quadrature (see FIG. 5C) with the one sampled by the flip-flops 72, 73 is sampled. Under locked conditions, one or both of the gates 77, 79 will indicate signal present. Only if signal actually ceases to transition at the clock frequencies will no signal be indicated. The signals may then be gated as shown through the logic gate 80 to produce the output signal.

Those of ordinary skill in the art will recognize that signals other than those shown in FIGS. 5C and 5D may be used. The signal that is sampled by the first pair of flip-flops need not be the 180° signal. The signal chosen should have a predetermined relationship with the clock signal CCLK such that the signals output by the flip-flops are as set forth above, or some other known relationship dependent upon the logic circuits and logic gates chosen. Although a quadrature relationship is desirable, it is not necessary as long as the signals have a known phase relationship that prevents a race condition from developing at both flip-flops at the same time. Furthermore, the "second signal" could be a time delayed version of the first signal.

Figure 6:
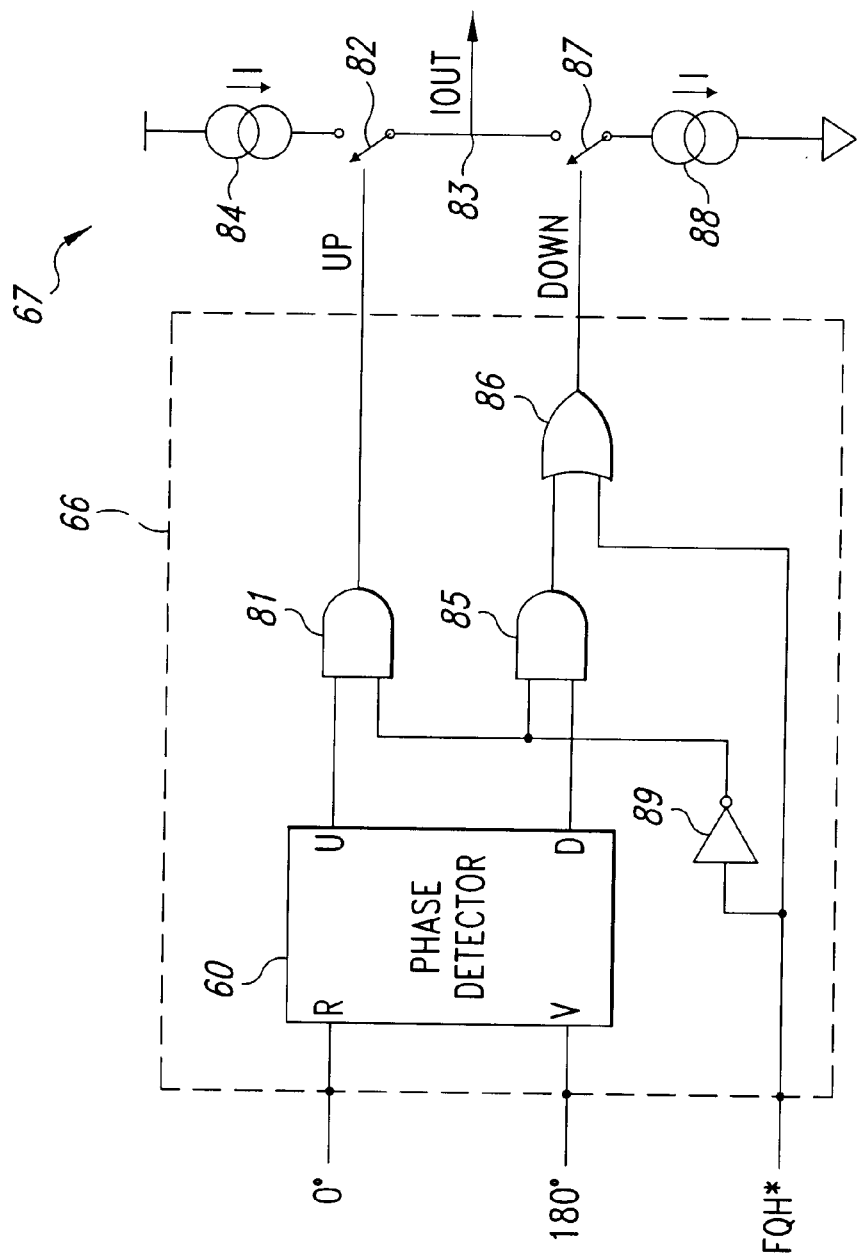
FIG. 6 is a more detailed view of the phase detector and charge pump of FIG. 3.

FIG. 6 illustrates the use of the output signal FQH* to ultimately control the charge pump 67. In FIG. 6, under normal operation conditions, a phase detector component 60 produces a signal at either the up terminal or the down terminal. The signal available at the up terminal propagates through an AND gate 81 to operate a switch 82 which connects an output terminal 83 to a constant current source 84 of current I. The down signal propagates through an AND gate 85 and an OR gate 86 to operate a switch 87 which connects the output terminal 83 to a constant current signal 88 of the same current I. During normal operation, the signal FQH* is low. AND gates 81 and 85 are enabled by virtue of an inverter 89, thereby allowing the up and down signals to propagate therethrough. However, upon assertion of the FQH* signal, the inverter 89 causes the signal input to the AND gates 81 and 85 to be low thereby preventing the up and down signals from propagating therethrough. The FQH* signal also propagates through the OR gate 86 to operate the switch 87. In that manner, the FQH* signal can override the normal up/down signals produced by the phase detector component 60 to connect the output terminal 83 to the constant current sink 88.

Figure 7:
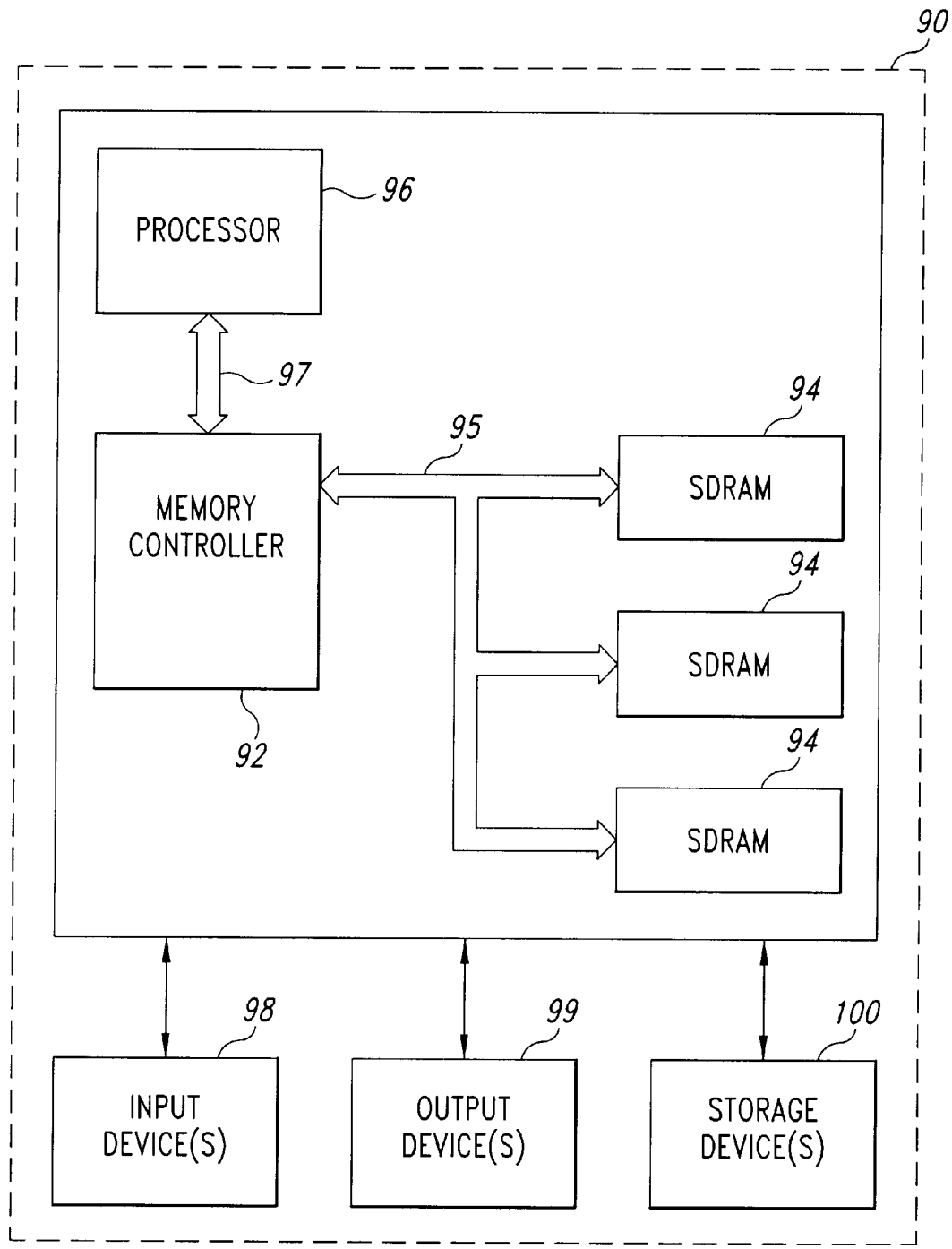
FIG. 7 illustrates a block diagram of a system in which the invention shown in FIG. 3 may be used.

FIG. 7 is a block diagram of a computer system 90. The computer system 90 utilizes a memory controller 92 in communication with SDRAMs 94 through a bus 95. The memory controller 92 is also in communication with a processor 96 through a bus 97. The processor 96 can perform a plurality of functions based on information and data stored in the SDRAMs 94. One or more input devices 98, such as a keypad or a mouse, are connected to the processor 96 to allow an operator to manually input data, instructions, etc. One or more output devices 99 are provided to display or otherwise output data generated by the processor 96. Examples of output devices include printers and video display units. One or more data storage devices 100 may be coupled to the processor 96 to store data on, or retrieve information from, external storage media. Examples of storage devices 100 and storage media include drives that accept hard and floppy disks, tape cassettes, and CD read only memories.

The present invention is also directed to a method of monitoring a delay-locked loop to determine loss of signal. The method is comprised of the steps of sampling a first signal output from the delay-locked loop with a clock signal. The first signal is also sampled with the inverse of the clock signal. A second signal, either output from the delay-locked loop or a delayed version of the first signal, is sampled with the clock signal. The second signal is also sampled with the inverse of the clock signal. An output signal is produced when the samples of the first signal do not satisfy a predetermined relationship and when the samples of the second signal do not satisfy a predetermined relationship. In a preferred embodiment, the samples of the first signal should have opposite values and the samples of the second signal should have opposite values. Should samples of the first signal have the same value and should samples of the second signal have the same value, then the output signal is produced.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A loss of signal detector for use with a delay-locked loop of the type which produces a plurality of output signals in response to a clock signal, said detector comprising:
    a first monitor for receiving a first signal of the plurality of output signals from the delay-locked loop, said first monitor including a first logic circuit for receiving the first signal and being clocked by the clock signal, and a second logic circuit for receiving the first signal and being clocked by the inverse of the clock signal;
    a second monitor for receiving a second signal of the plurality of output signals from the delay-locked loop, the first and second signals having a known phase relationship which prevents a race condition from developing at said monitors, said second monitor comprising a third logic circuit for receiving the second signal and being clocked by the clock signal, and a fourth logic circuit for receiving the second signal and being clocked by the inverse of the clock signal; and
    a plurality of logic gates responsive to said first and second monitors and configured to produce an output signal when said first one of the plurality of output signals ceases to transition at the frequency of the clock signal.

2. The detector of claim 1 wherein said first, second, thrid, and fourth logic circuits include D-type flip-flops.

3. The detector of claim 1 wherein said plurality of logic gates includes a first logic gate responsive to said first monitor, a second logic gate responsive to said second monitor, and a third logic gate responsive to said first and second logic gates.

4. The loss of signal detector of claim 1 wherein said known phase relationship includes a quadrature relationship.

5. A loss of signal detector for use with a delay-locked loop of the type which produces a plurality of output signals in response to a clock signal, said detector comprising:
    a first logic circuit for receiving a first signal from the delay-locked loop and for being clocked by the clock signal;
    a second logic circuit for receiving the first signal from the delay-locked loop and for being clocked by the inverse of the clock signal;
    a third logic circuit for receiving a second signal from the delay-locked loop and for being clocked by the clock signal;
    a fourth logic circuit for receiving the second signal from the delay-locked loop and for being clocked by the inverse of the clock signal, the first and second signals having a known phase relationship that excludes an in phase relationship; and
    a plurality of logic gates responsive to said first, second, third, and fourth logic circuits and configured to produce an output signal upon loss of signal from the delay-locked loop.

6. The detector of claim 5 wherein said plurality of logic gates comprises a first logic gate responsive to said first and second logic circuits, a second logic gate responsive to said third and fourth logic circuits, and a third logic gate responsive to said first and second logic gates.

7. The detector of claim 5 wherein said known phase relationship includes the first and second signals being in quadrature with respect to each other.

8. A delay-locked loop having a loss of signal detector, comprising:
    a delay line for producing a plurality of signals in response to an external clock signal, each of said plurality of signals being delayed a predetermined period of time with respect to said external clock signal;
    a first feedback path responsive to certain of said plurality of signals for producing a feedback signal input to said delay line;
    a first monitor for receiving a first signal of the said plurality of output signals from said delay line;
    a second monitor for receiving a second signal of the said plurality of output signals from said delay line, said first and second signals having a known phase relationship excluding in-phase relationships, each of said monitors being clocked with the external clock signal and the inverse of the external clock signal; and
    a plurality of logic gates responsive to said first and second monitors and configured to produce an output signal upon loss of signal from said delay-locked loop.

9. The delay-locked loop of claim 8 wherein said first monitor comprises a first logic circuit for receiving the first signal and being clocked by the external clock signal and a second logic circuit for receiving the first signal and being clocked by the inverse of the external clock signal, and wherein said second monitor comprises a third logic circuit for receiving the second signal and being clocked by the external clock signal and a fourth logic circuit for receiving the second signal and being clocked by the inverse of the external clock signal.

10. The detector of claim 9 wherein said first, second, third, and fourth logic circuits include D-types flip-flops.

11. The detector of claim 8 wherein said plurality of logic gates includes a first logic gate responsive to said first monitor, a second logic gate responsive to said second monitor, and a third logic gate responsive to said first and second logic gates.

12. The delay-locked loop of claim 8 wherein said known phase relationship includes a quadrature relationship.

13. A synchronous clock generator, comprising:

a receiver for receiving an external clock signal;

a delay line for producing a plurality of signals in response to the received external clock signal, each of said plurality of signals being delayed a predetermined period of time with respect to said external clock signal;

a plurality of multiplexers responsive to said delay line for producing at least one clock signal in response to control signals;

a first feedback path responsive to certain of said plurality of signals for producing a feedback signal input to said delay line;

a first monitor for receiving a first signal of said plurality of output signals from said delay line;

a second monitor for receiving a second signal of said plurality of output signals from said delay line, said first and second signals having a known phase relationship which prevents a race condition from developing at said monitors, each of said monitors being clocked with the external clock signal and the inverse of the external clock signal; and a plurality of logic gates responsive to said first and second monitors and configured to produce an output signal when said first one of the plurality of output signals ceases to transition at the frequency of the clock signal.

14. The synchronous clock generator of claim 13 wherein said first monitor is responsive to a 180° signal and said second monitor is responsive to a 90° signal.

15. A method of monitoring a delay-locked loop to determine loss of signal, comprising:

sampling a first signal output from the delay-locked loop with a clock signal;

sampling the first signal output from the delay-locked loop with the inverse of the clock signal;

sampling a second signal output from the delay-locked loop with the clock signal;

sampling the second signal output from the delay-locked loop with the inverse of the clock signal, said first and second signals having a know phase relationship that excludes an in-phase relationship; and producing an output signal when the samples of the first signal do not satisfy a predetermined phase relationship and when the samples of the second signal do not satisfy a predetermined phase relationship.

16. A system, comprising:

a processor;

a memory controller;

a plurality of memory devices;

a first bus interconnecting said processor and said memory controller; and a second bus interconnecting said memory controller and said memory devices;

each of said memory devices having a synchronous clock generator, comprising:

a receiver for receiving an external clock signal;

a delay line for producing a plurality of signals in response to the received external clock signal, each of said plurality of signals being delayed a predetermined period of time with respect to said external clock signal;

a plurality of multiplexers responsive to said delay line for producing at least one clock signal in response to control signals;

a driver for driving said at least one clock signal;

a first feedback path responsive to certain of said plurality of signals for producing a feedback signal input to said delay line;

a first monitor for receiving a first signal of said plurality of output signals from said delay line;

a second monitor for receiving a second signal of said plurality of output signals from said delay line, said first and second signals having a known phase relationship which prevents a race condition from developing at said monitors, each of said monitors being clocked with the external clock signal and the inverse of the external clock signal; and a plurality of logic gates responsive to said first and second monitors and configured to produce an output signal when said first one of said plurality of output signals ceases to transition at the frequency of the external clock signal.

* * * * *

UNITED STATES PATENT AND TRADEMARK OFFICE
CERTIFICATE OF CORRECTION

PATENT NO. : 5,926,047
DATED : July 20, 1999
INVENTOR(S) : Harrison

It is certified that error appears in the above-identified patent and that said Letters Patent is hereby corrected as shown below:

Column 5, line 25        reads "08/915/185"        should read - - 08/915/195 - -

Column 7, line 61        reads "thrid"        should read - - third - -

Signed and Sealed this

Seventeenth Day of April, 2001

Attest:

NICHOLAS P. GODICI

*Attesting Officer*      *Acting Director of the United States Patent and Trademark Office*